United States Patent
Seo et al.

(10) Patent No.: US 10,534,332 B2
(45) Date of Patent: Jan. 14, 2020

(54) ELECTRONIC HOME APPLIANCE AND CONTROL METHOD THEREOF

(71) Applicant: LG ELECTRONICS INC., Seoul (KR)

(72) Inventors: Soomin Seo, Seoul (KR); Soyeon Ko, Seoul (KR); Youjin Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 802 days.

(21) Appl. No.: 14/593,008

(22) Filed: Jan. 9, 2015

(65) Prior Publication Data
US 2015/0192915 A1 Jul. 9, 2015

(30) Foreign Application Priority Data
Jan. 9, 2014 (KR) .................. 10-2014-0002985

(51) Int. Cl.
G05B 15/00 (2006.01)
G05B 15/02 (2006.01)
H03G 7/00 (2006.01)

(52) U.S. Cl.
CPC ............... *G05B 15/02* (2013.01); *H03G 7/00* (2013.01)

(58) Field of Classification Search
CPC ....................................................... G05B 15/02
USPC ........................................................ 700/275
See application file for complete search history.

(56) References Cited

U.S. PATENT DOCUMENTS

| | | | | |
|---|---|---|---|---|
| 4,679,034 A * | 7/1987 | Kamada | .................. | G08B 13/19 340/529 |
| 9,380,982 B2 * | 7/2016 | Battista, Jr. | ......... | G06F 19/3406 |
| 9,702,619 B2 * | 7/2017 | Kendall | ................ | F25D 27/005 |
| 2004/0189474 A1 * | 9/2004 | Borovoy | .................. | G08B 1/08 340/573.1 |
| 2004/0239517 A1 * | 12/2004 | Coley | .................... | G08B 21/02 340/686.6 |
| 2013/0057573 A1 * | 3/2013 | Chakravarthula | ...... | G06F 3/005 345/619 |
| 2014/0274078 A1 * | 9/2014 | Hyde | .................... | H04W 16/18 455/446 |

FOREIGN PATENT DOCUMENTS

| | | | |
|---|---|---|---|
| CN | 1816832 | 8/2006 | |
| CN | 103401518 | 11/2013 | |
| DE | 101 44 667 A1 | 3/2003 | |
| EP | 2 031 121 A1 | 3/2009 | |
| GB | 2266799 A * | 11/1993 | ......... B60R 25/1004 |
| JP | 2000111238 A * | 4/2000 | |
| WO | WO 2014/104775 A1 | 7/2014 | |

OTHER PUBLICATIONS

European Search Report dated Jul. 13, 2015 for European Application No. 15150468.5, 6 pages.
Office Action issued in Chinese Application No. 201510011552.7 dated May 23, 2016, 13 pages (with English translation).

* cited by examiner

*Primary Examiner* — Evral E Bodden
(74) *Attorney, Agent, or Firm* — Fish & Richardson P.C.

(57) ABSTRACT

An electric home appliance includes a sensing unit configured to sense whether a user's body is within a predetermined range from the electric home appliance, an output unit configured to output a sound, and a controller configured to determine a sound output mode of the output unit based on a location of the user's body sensed by the sensing unit.

13 Claims, 7 Drawing Sheets

ELECTRONIC HOME APPLIANCE AND CONTROL METHOD THEREOF

CROSS-REFERENCE TO RELATED APPLICATION

This application claims the priority benefit of Korean Patent Application No. 10-2014-0002985, filed on Jan. 9, 2014, in the Korean Intellectual Property Office, the disclosure of which is incorporated herein by reference.

TECHNICAL FIELD

The present application relates to an electric home appliance and a control method thereof.

BACKGROUND

In general, an electric home appliance can include an air conditioner for conditioning indoor air, a laundry treatment apparatus for treating laundry, or a refrigerator for storing food. For example, the laundry treatment apparatus may include a washing machine, a drying machine, and a washing and drying machine.

The washing machine is an apparatus that can perform a series of processes including washing, rinsing, and spin-drying to remove contaminants from laundry, such as clothing and bedding, using water, detergent, and mechanical actions. The washing machine may be classified as a top load type washing machine configured such that a drum, in which laundry is placed, is rotated about a vertical shaft or a front load type washing machine configured such that a drum, in which laundry is placed, is rotated about a horizontal shaft.

The drying machine is an apparatus that can apply hot air to laundry, such as clothing, to dry the laundry. Specifically, laundry is introduced into a drum, and hot air or cold air is supplied into the drum during rotation of the drum to dry the laundry.

The washing and drying machine is an apparatus having both a washing function and a drying function. Specifically, laundry is introduced into a drum, and a desired function is executed during rotation of the drum to wash or dry the laundry.

The electric home appliance, such as the laundry treatment apparatus, may provide an operation state of the electric home appliance to a user. In some cases, there may be a need for a method of effectively providing information based on situation of the user.

SUMMARY

It is an object of the present application to provide an electric home appliance that is capable of deciding a sound output mode of an output unit based on location of a user and a control method thereof.

According to one aspect, an electric home appliance includes a sensing unit configured to sense whether a user's body is within a predetermined range from the electric home appliance, an output unit configured to output a sound, and a controller configured to determine a sound output mode of the output unit based on a location of the user's body sensed by the sensing unit.

Implementations of this aspect may include one or more of the following features. For example, the sensing unit may include a noise sensor that is configured to sense a noise level of a surrounding environment, and the controller may be configured to determine a volume of the sound output by the output unit based on the noise level sensed by the noise sensor. The controller may be configured to decide a volume and a quality of the sound output by the output unit based on whether the user's body is within the predetermined range. The controller may be configured to determine whether the user's body approaches the electric home appliance within a predetermined time after a first notification sound is output through the output unit. The controller may be configured to, based on a determination that the user's body does not approach the electric home appliance within the predetermined time after the first notification sound is output through the output unit, output a second notification sound having a different volume or type than the first notification sound through the output unit. The controller may be configured to adjust a sampling interval of a notification sound that is output by the output unit based on a distance value from the user's body.

Further according to this aspect, the controller may be configured to, based on occurrence of an event that requires providing information to the user, determine whether the user's body is within the predetermined range. The output unit may include a display unit that is configured to visually provide information, and the controller may be configured to, based on a determination that the user's body is within the predetermined range for a predetermined time or more after the event has occurred, control the display unit to visually provide information. The controller may be configured to, based on a determination that the user's body is within the predetermined range for less than the predetermined time after the event has occurred, control the output unit to output a notification sound. The output unit may be configured to output a voice. The controller may be configured to, based on a determination that the user's body does not approach the electric home appliance within the predetermined time after the first notification sound is output through the output unit, output a second notification sound having a different volume than the first notification sound through the output unit. The controller may be configured to, based on a determination that the user's body does not approach the electric home appliance within the predetermined time after the first notification sound is output through the output unit, output a second notification sound that is a different type than the first notification sound through the output unit.

According to another aspect, a control method of an electric home appliance includes sensing, via a sensing unit, whether a user's body is within a predetermined range from the electric home appliance, calculating a distance value of the user's body from the electric home appliance, determining a sound output mode of an output unit based on presence or absence of the user's body and the calculated distance value, and causing the output unit to output sound according to the determined sound output mode.

Implementations of this aspect may include one or more of the following features. For example, determining the sound output mode may include deciding a volume and a quality of an output sound based on the calculated distance. The control method may further include sensing a noise level of a surrounding environment via a noise sensor. Determining the sound output mode may include deciding a volume of an output sound based on the sensed noise level. Deciding the sound output mode may include adjusting a sampling interval of an output notification sound based on the calculated distance value. Deciding the sound output mode may include determining, in a case in which an event indicating that it is necessary to provide a notification sound to a user has occurred, whether to output the notification sound based on whether the user's body is within the predetermined range when the event has occurred. Deciding the sound output mode may include outputting the notification sound based on a determination that the user's body deviated from the predetermined range without responding to the event. Causing the output unit to output sound may include causing the output unit to output a voice.

BRIEF DESCRIPTION OF THE DRAWINGS

The above and other objects, features and other advantages of the present application will be more clearly understood from the following detailed description taken in conjunction with the accompanying drawings, in which.

DETAILED DESCRIPTION

Advantages and features of the present application and a method of achieving the same will be more clearly understood from implementations described below with reference to the accompanying drawings. However, the present application is not limited to the following implementations but may be implemented in various different forms. The implementations are provided merely to complete disclosure of the present application and to fully provide a person having ordinary skill in the art to which the present application pertains with the category of the application. The application is defined only by the category of the claims. Wherever possible, the same reference numbers will be used throughout the specification to refer to the same or like parts.

Terms used in the description of the application are provided only to explain specific implementations but are not intended to restrict the application. In the description of the application and the accompanying claims, the singular forms are intended to include the plural forms as well, unless context clearly indicates otherwise. The use of marks may indicate any one or both of the singular forms and the plural forms of the terms, and vice versa.

It will be understood that the term "and/or" refers to one or more possible combinations of specified relevant items and includes such combinations. It will be further understood that the terms "comprises" or "comprising" used in this specification designate presence of specified features, integers, steps, operations, elements, and/or components but do not exclude presence or addition of one or more other features, integers, steps, operations, elements, components, and/or groups thereof.

Hereinafter, implementations of computing devices, user interfaces for the computing devices, and related processes necessary to use the computing device may be described.

Reference will now be made in detail to the preferred implementations of the present application, examples of which are illustrated in the accompanying drawings. Hereinafter, a washing machine, which is one example of an electric home appliance, will be described by way of example. However, the present application is not limited thereto. For example, the idea of the present application may be applied to other laundry treatment apparatuses, such as a drying machine, an oven, an air conditioner, and a refrigerator.

Figure 1:
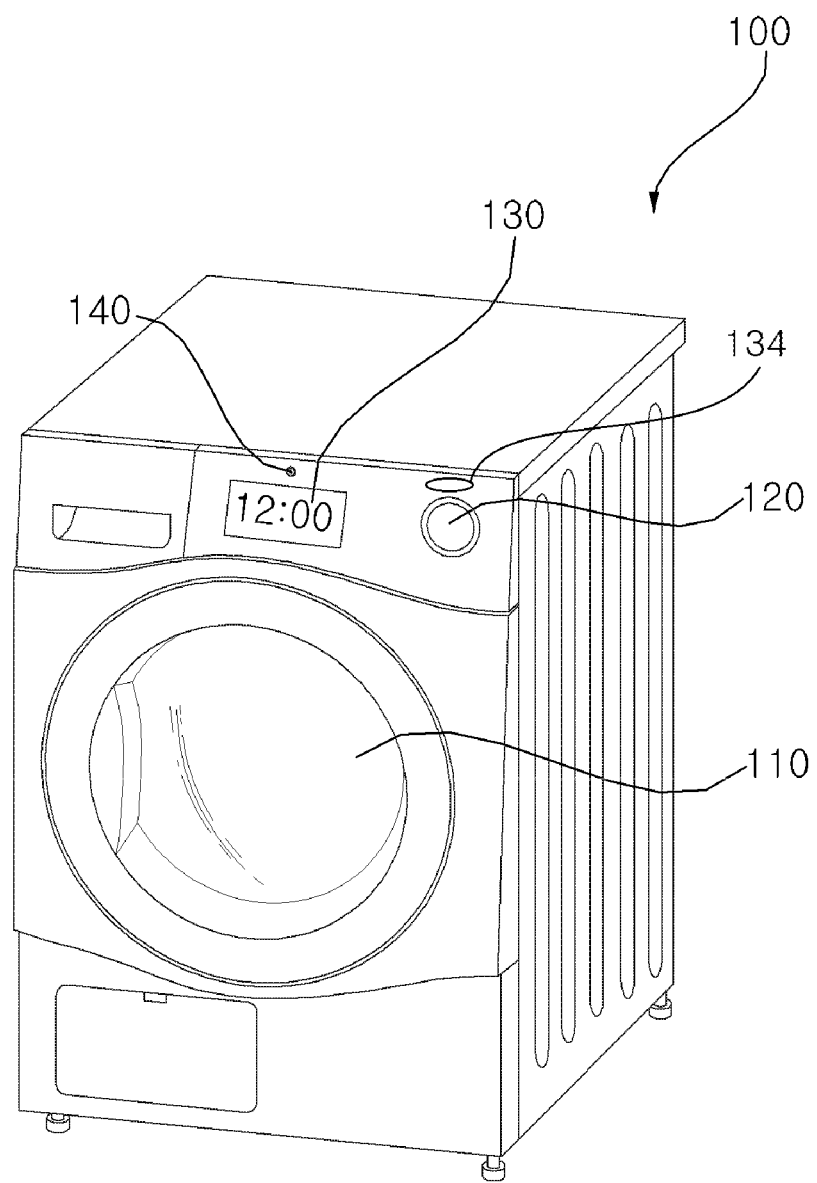
FIG. 1 is a perspective view showing an example washing machine according to an implementation of the present application.

Referring to FIG. 1, a washing machine 100, which is one example of an electric home appliance according to an implementation of the present application, may include a case forming the external appearance of the washing machine and a drum rotatably provided in the case for receiving laundry, such as clothing. The drum may be provided at an internal circumferential surface thereof with a plurality of lifters for lifting clothing upward and dropping the clothing downward when the drum is rotated.

The case may be provided at the front thereof with a clothing introduction port, which can be opened such that clothing may be introduced into the drum through the clothing introduction port. The case may be provided at the upper side of the front thereof with an output unit 130 for outputting control information of the washing machine. The output unit 130 may include a light source, such as a liquid crystal display (LCD) or a light emitting diode (LED), for displaying control information of the washing machine. However, the present application is not limited thereto.

A door 110 may be mounted at the clothing introduction port. The door 110 may open and close the clothing introduction port, which is an entrance through which clothing is introduced into the drum. The door 110 may be manually manipulated by a user or operated according to electronic control. The door 110 may be hingedly connected to the case.

An input unit 120 may be disposed at the front of the washing machine 100. The input unit 120 may be protruded or retreated. However, the present application is not limited thereto. For example, the input unit 120 may be configured in the form of a rotary dial. The input unit 120 may be disposed in the case of the washing machine and may be protruded outward from the case depending upon location of the user.

The output unit 130 may output various kinds of information. The output unit 130 may display an operation mode, an operation time, or weather information. However, the present application is not limited thereto. In FIG. 1, the output unit 130 is shown as a display unit for visually displaying information. However, the present application is not limited thereto. For example, the output unit 130 may include a speaker 134 for aurally outputting information. Idea of the present application may be applied to the display unit or the speaker 134 as the output unit 130 for outputting information. However, the output unit 130 is not limited to any one selected from between the display unit and the speaker 134.

The output unit 130 may change an information display mode when a user approaches the washing machine.

The electric home appliance may include a sensing unit 140 for sensing whether an object is in front of the electric home appliance. The sensing unit 140 may sense whether an object is within a predetermined distance from the electric home appliance 100. For example, the sensing unit 140 may sense whether a human body is within a predetermined range. The sensing unit 140 may be disposed at the upper part of the middle of the case. However, the present application is not limited thereto. For example, the sensing unit 140 may be disposed at the upper end of the right side or the left side of the case depending upon the type of a sensor included in the sensing unit 140.

Figure 2:
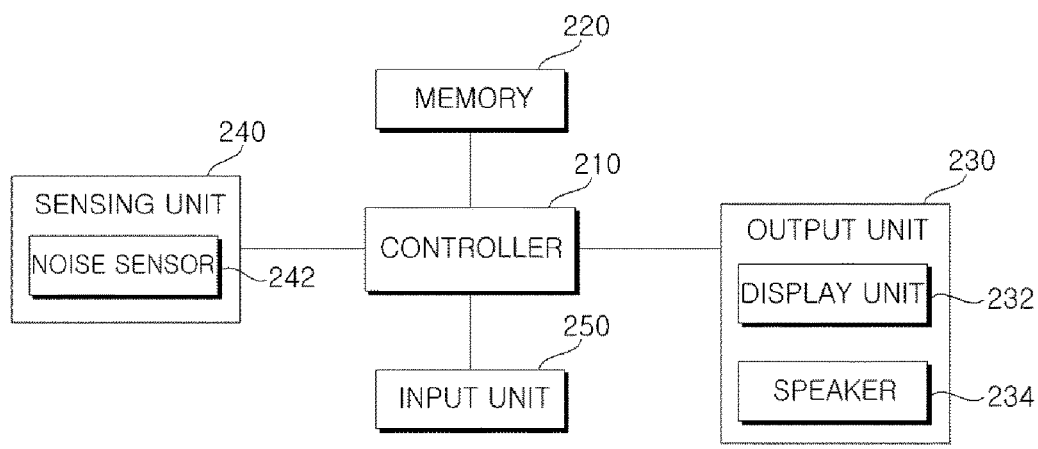
FIG. 2 is a block diagram showing components of an example electric home appliance according to another implementation of the present application.

FIG. 2 is a block diagram showing components of an electric home appliance according to another implementation of the present application.

Referring to FIG. 2, the electric home appliance according to the implementation of the present application may include a sensing unit 240 for sensing whether a human body is within a predetermined range, an output unit 230 for outputting information, and a controller 210 for deciding an information output mode of the output unit 230 based on presence or absence of the human body sensed by the sensing unit 240.

The controller 210 may control operation of the electric home appliance. The controller 210 may transmit and receive a control signal to and from the other components of the electric home appliance. The controller 210 may transmit a signal to each component of the electric home appliance to control each component.

The controller 210 may output data stored in a memory 220 to the output unit 230 or execute a program stored in the memory 220 to process the data.

The controller 210 may recognize a time during which the human body is within the predetermined range. For example, the controller 210 may recognize whether the human body is within the predetermined range based on a signal output as a result of presence or absence of an object sensed by the sensing unit 240.

The controller 210 may recognize whether the human body is within the predetermined range for a predetermined time or more. In a case in which the human body deviates from the predetermined range, the controller 210 may initialize time. In a case in which the human body reenters the predetermined range, the controller 210 may recalculate time from the beginning.

In a case in which the human body is within the predetermined range for the predetermined time or more, the controller 210 may control the output unit 230 to defer outputting a notification sound. For example, in a case in which the human body is within the predetermined range for less than the predetermined time, the controller 210 may control the output unit 230 to output the notification sound. On the other hand, in a case in which the human body is within the predetermined range for the predetermined time or more, the controller 210 may control the output unit 230 to output an optical pattern and to defer outputting the notification sound.

The controller 210 may control the output unit 230 to output information in different modes according to the distance from the human body. For example, as the distance from the human body decreases, the controller 210 may control the output unit 230 to output detailed information. For example, as the distance from the human body increases, the controller 210 may decrease quality of the notification sound output by the output unit 230. For example, in a case in which the distance from the human body is large, the controller 210 may widen a sampling interval of the notification sound output by the output unit 230 such that the sampling interval of the notification sound is wider than the sampling interval of the notification sound in a case in which the distance from the human body is small. However, the present application is not limited thereto.

As the distance from the human body decreases, the controller 210 may increase quality of information output by the output unit 230. As the distance from the human body increases, the controller 210 may decrease quality of information output by the output unit 230. As the distance from the human body increases, the controller 210 may simplify a format of information output by the output unit 230.

The controller 210 may decide the type, display mode, etc. of information output by the output unit 230 based on a distance value from the human body. For example, the controller 210 may decide the size of text output by the output unit 230, the type, quality, and volume of the notification sound output by the output unit 230, or the type of information output by the output unit 230 based on a distance range, within which the distance value from the human body is.

For example, the controller 210 may set a plurality of distance ranges. The distance ranges may include a first distance range, a second distance range greater than the first distance range, and a third distance range greater than the second distance range.

In some cases, the output unit 230 includes a display unit 232 for visually outputting information.

In a case in which the distance value from the human body is within the third distance range, the controller 210 may control the output unit 230 to output a current use mode and a current time. In a case in which the distance value from the human body is within the second distance range, the controller 210 may control the output unit 230 to display various temperature values necessary for control or a procedure of a current use mode. In a case in which the distance value from the human body is within the first distance range, the controller 210 may control the output unit 230 to display information for function setting.

The controller 210 may decide luminance of the display unit 232 based on the distance value from the human body. For example, as the distance value from the human body decreases, the controller 210 may decrease a luminance value of the display unit 232. On the other hand, as the distance value from the human body increases, the controller 210 may increase the luminance value of the display unit 232.

The controller 210 may determine whether the human body gazes at the electric home appliance. For example, the sensing unit 240 may sense pupils of the human body and the controller 210 may determine whether the human body gazes at the electric home appliance based on motion of the pupils of the human body. The controller 210 may adjust luminance of the display unit 232 based on the determination as to whether the human body gazes at the electric home appliance. For example, in a case in which the human body gazes at the electric home appliance, the controller 210 may decrease the luminance of the display unit 232. However, the present application is not limited thereto.

In some cases, the output unit 230 includes a speaker 234 for aurally outputting information.

The controller 210 may output a notification sound through the output unit 230. For example, as the distance value from the human body increases, the controller 210 may decrease quality of the notification sound output by the output unit 230. For example, as the distance from the human body increases, the controller 210 may widen a sampling interval of the notification sound output by the output unit 230. However, the present application is not limited thereto.

The controller 210 may adjust a sampling interval of the notification sound output by the output unit 230 based on the distance value from the human body. For example, as the distance value from the human body decreases, the controller 210 may increase quality of the notification sound output by the output unit 230. For example, as the distance from the human body decreases, the controller 210 may narrow the sampling interval of the notification sound output by the output unit 230. However, the present application is not limited thereto. For example, as the distance from the human body increases, the controller 210 may widen the sampling interval of the notification sound output by the output unit 230.

The controller 210 may adjust volume of the output unit 230 based on the distance value from the human body. For example, as the distance from the human body decreases, the controller 210 may decrease the volume of the output unit 230. On the other hand, as the distance from the human body increases, the controller 210 may increase the volume of the output unit 230.

In a case in which the speaker 234 outputs a notification sound and there is no user response for a predetermined time or more, the controller 210 may change the type of the notification sound output by the speaker 234 or increase the volume of the notification sound.

The controller 210 may decide the volume and quality of a sound output, for example a voice output, by the output unit 230 based on whether the human body is within the predetermined range. The controller 210 may determine whether the human body approaches the electric home appliance within a predetermined time after the notification sound is output by the output unit 230.

The controller 210 may determine whether an event indicating that it is necessary to provide information to the user has occurred. In a case in which the event indicating that it is necessary to provide information to the user has occurred, the controller 210 may determine whether the human body is within the predetermined range.

For example, the controller 210 may determine whether an event indicating that the operation of the washing machine has been completed has occurred. In another implementation in which the electric home appliance is a refrigerator, the controller 210 may determine whether an event indicating that a door of the refrigerator is open has occurred.

In a case in which the event has occurred, the controller 210 may determine whether the human body is within the predetermined range. In a case in which the human body is sensed by the sensing unit 240, the controller 210 may recognize a time during which the human body is within the predetermined range.

In a case in which the human body is within the predetermined range for a predetermined time or more after the event has occurred, the controller 210 may control the output unit 230 to defer outputting a notification sound. In a case in which the human body is within the predetermined range for the predetermined time or more after the event has occurred, the controller 210 may visually display information through the output unit 230 instead of outputting the notification sound.

For example, the controller 210 may display an optical pattern having a blinking light through the display unit 232 as the output unit 230 to inform that the event has occurred. However, the present application is not limited thereto. The output unit 230 may informs the user that the event has occurred through text, etc.

After visually displaying the information through the output unit 230, the controller 210 may determine whether there is a user response. In a case in which the electric home appliance is a refrigerator, the controller 210 may output a notification sound through the output unit 230 when the user deviates from the predetermined range without closing a door of the refrigerator although the controller 210 has displayed that a door of the refrigerator is open through the output unit 230.

In a case in which the human body does not stay within the predetermined range for a predetermined time or more although the human body is within the predetermined range after the event has occurred, the controller 210 may output a notification sound through the output unit 230.

In a case in which there is no user response for a predetermined time or more after the notification sound is output through the output unit 230, the controller 210 may change the volume or type of the notification sound. For example, in a case in which there is no user response for a predetermined time or more after the notification sound is output through the output unit 230, the controller 210 may output a notification sound simpler than the previous notification sound and increase the volume of the simplified notification sound.

For example, in a case in which the human body does not approach the electric home appliance within a predetermined time or more after the notification sound is output through the output unit 230, the controller 210 may output a notification sound having different volume or type from the previous notification sound through the output unit 230. In a case in which the speaker 234 outputs a notification sound and there is no user response for a predetermined time or more, the controller 210 may change the type of the notification sound output by the speaker 234 or increase the volume of the notification sound.

In some cases, the controller 210 may recognize a noise level of the surroundings. For example, the controller 210 may recognize a noise level of the surroundings based on information received from a noise sensor 242. The controller 210 may decide the volume of a notification sound output by the output unit 230 in consideration of the noise level of the surroundings. The controller 210 may decide a plurality of noise ranges necessary to decide a noise level. The controller 210 may increase or decrease the volume of the sound output, for example the voice output, by the output unit 230 based on one of the noise ranges within which a current noise level of the surroundings is.

The controller 210 may determine presence or absence of use information of the human body sensed by the sensing unit 240. The controller 210 may analyze identity of the human body using the electric home appliance. For example, the controller 210 may store use information, including information regarding whether the human body sensed by the sensing unit 240 has used the electric home appliance, in the memory 220. For example, the controller 210 may store use information, including information regarding the shape, size, fingerprint, etc. of the human body sensed by the sensing unit 240, in the memory 220.

The controller 210 may determine presence or absence of use information corresponding to the human body sensed by the sensing unit 240. In a case in which the use information is present, the controller 210 may display a plurality of use modes through the output unit 230 based on the use information. For example, the controller 210 may output the use modes through the output unit 230 in order of high use frequency based on the use information. However, the present application is not limited thereto.

In a case in which the use information is absent, the controller 210 may display all manipulatable functions, a sequence of cycles, remaining time, and other detailed information through the output unit 230. However, the present application is not limited thereto.

Meanwhile, the controller 210 may be embodied using at least one selected from among application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, and electrical units for performing other functions.

The memory 220 may include a high-speed random access memory. The memory 220 may include nonvolatile memories, such as one or more magnetic disc storage devices, flash memory devices, or other nonvolatile solid memory devices. However, the present application is not limited thereto. The memory 220 may include a readable storage medium.

For example, the memory 220 may include an electronically erasable and programmable read only memory (EEP-ROM). However, the present application is not limited thereto. Information may be written into the EEP-ROM or removed from the EEP-ROM under control of the controller 210. The EEP-ROM may be a storage device that retains information without removal of the information even when the electric home appliance is powered off and, therefore, power is not supplied to the EEP-ROM.

The memory 220 may be interlocked with the controller 210 to store various programs or data. Programs stored in the memory 220 may be executed by the controller 210.

The output unit 230 may display various kinds of information. The output unit 230 may include a display unit 232 for visually displaying various kinds of information or a speaker 234 for aurally outputting various kinds of information.

The display unit 232, which is the output unit 230 for visually displaying information, may include at least one selected from among a light emitting polymer display (LPD), a liquid crystal display, a thin film transistor-liquid crystal display, an organic light-emitting diode, a flexible display, and a three-dimensional (3D) display. However, the present application is not limited thereto.

The output unit 230 may output information necessary to control the electric home appliance. For example, in a case in which the electric home appliance is a washing machine, the output unit 230 may output a washing mode, a washing time, etc. However, present application is not limited thereto. The output unit 230 may display all information necessary to control the washing machine.

The sensing unit 240 may be disposed at the front of the electric home appliance. The sensing unit 240 may sense whether an object is within a predetermined range. For example, the sensing unit 240 may include at least one selected from among a camera, a kinetic sensor, and an infrared sensor. However, the present application is not limited thereto. The sensing unit 240 may include any sensor that is capable of sensing presence or absence, distance, shape, or size of a human body.

The sensing unit 240 may sense whether an object is within a predetermined range and transmit information regarding presence or absence of the object to the controller 210. The sensing unit 240 may sense a distance from an object or a human body.

For example, the sensing unit 240 may include a stereo camera. In this case, the electric home appliance 100 may include an image processor. The image processor may recognize a distance from an object or a human body based on stereo images acquired by the stereo camera. The image processor may be configured separately from the controller 210 and may be included in the sensing unit 240. Alternatively, the image processor may be modularized as a software component and may be included in the controller 210. In some cases, the sensing unit 240 may include a mono camera. In this case, the electric home appliance 100 may include an image processor. The image processor may recognize a distance from an object or a human body based on the change in size of the object or the human body in images acquired by the mono camera. The image processor may be configured separately from the controller 210 and may be included in the sensing unit 240. Alternatively, the image processor may be modularized as a software component and may be included in the controller 210.

For example, in a case in which the sensing unit 240 includes an ultrasonic sensor, the sensing unit 240 may sense a distance from an object or a human body through a time difference between transmitted and received signals.

For example, the sensing unit 240 may include an infrared sensor and a camera. In this case, when an infrared laser beam is emitted to an object or a human body, an image sensor included in the camera may receive a reflected laser beam point to measure a distance per pixel. The sensing unit 240 may sense the distance from the object or the human body based on the measured distance per pixel.

In some cases, the kinetic sensor may include a depth sensor. The depth sensor may include an image sensor, such as a complementary metal-oxide-semiconductor (CMOS) sensor or a charge-coupled device (CCD) sensor, or an infrared laser beam projector. When an infrared laser beam is emitted to an object or a human body, the image sensor may receive a reflected laser beam point to measure a distance per pixel. The sensing unit 240 may sense the distance from the object or the human body based on the measured distance per pixel.

In a case in which the sensing unit 240 includes a camera, the sensing unit 240 may sense whether a human body gazes at the electric home appliance. Specifically, the camera may detect pupils of the human body. At this time, an image processor may detect the pupils using a circular detection template, a circular edge detection method, a Daugman's circular edge detection method, etc. Alternatively, the image processor may detect the pupils using Hough transform, Haar-like feature, Adaboost algorithm, etc. The image processor may be configured separately from the controller 210. Alternatively, the image processor may be functionally modularized and may be included in the controller 210.

The sensing unit 240 may include a noise sensor 242. For example, the sensing unit 240 may include a microphone for sensing external noise. The sensing unit 240 may sense a noise level of the surroundings and provide the information to the controller 210. The sensing unit 240 may convert the sensed noise into electrical signal and provide the electrical signal to the controller. At this time, the electrical signal may include information regarding the sensed noise level.

The input unit 250 may allow a user's input. For example, the input unit 250 may be a dial that can be rotated by manipulation of a user. However, the present application is not limited thereto. For example, the input unit 250 may be a touch pad or a mechanical button.

The input unit 250 may be enabled or disabled by a command from the controller 210. The input unit 250 may be protruded or retreated by the command from the controller 210. When the user is near the electric home appliance, the input unit 250 may be protruded or enabled. When the user deviates from a predetermined range, the input unit 250 may return to the original position thereof or may be disabled. However, the present application is not limited thereto.

Figure 3:
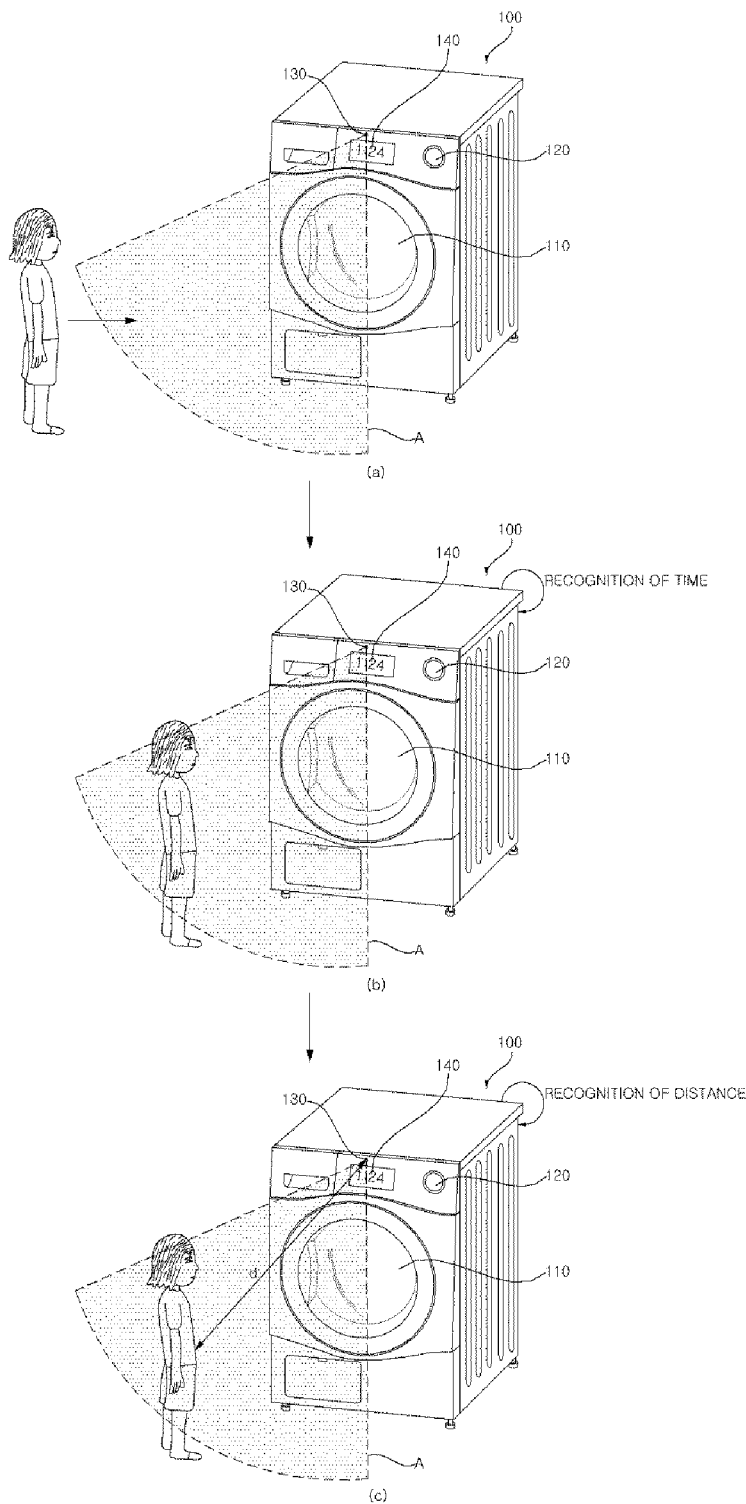
FIGS. 3 to 5 are schematic views showing an example control process of the electric home appliance.
Figure 4:
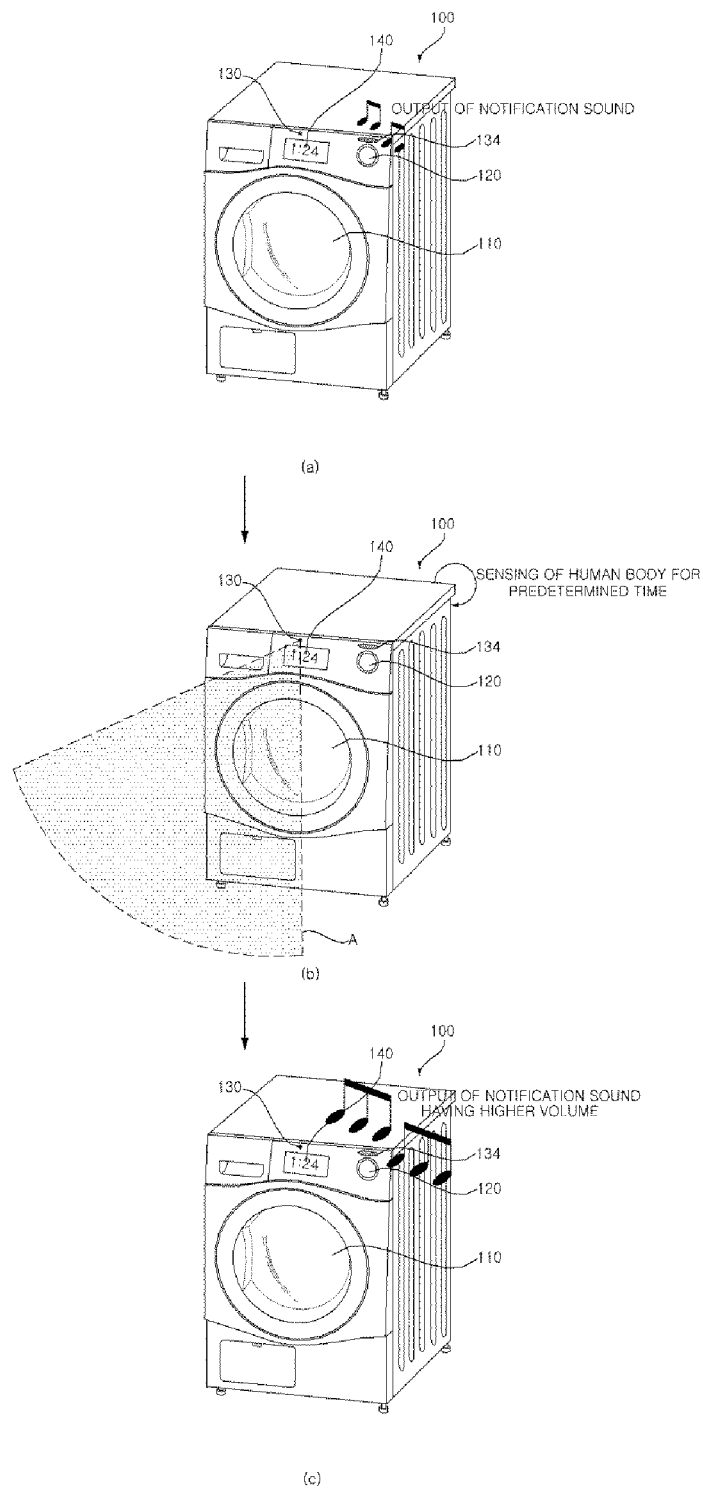
Figure 5:
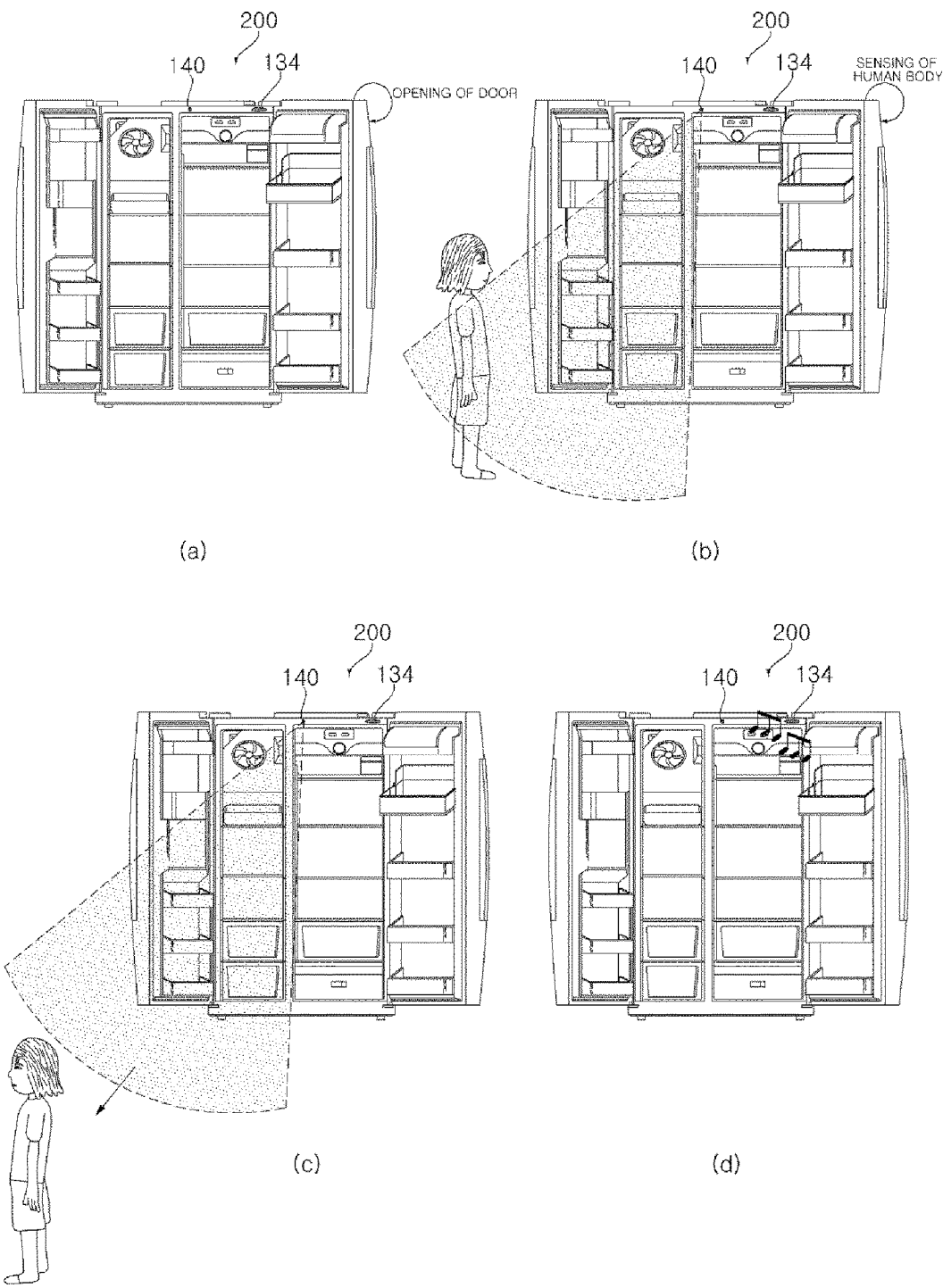

FIGS. 3 to 5 illustrate an example control process of the electric home appliance according to one implementation of the present application.

Referring to FIG. 3(a), in a case in which the electric home appliance according to the implementation of the present application is a washing machine, the sensing unit 140 may sense whether a human body is within a predetermined range.

In some cases, the electric home appliance may recognize a time during which the human body is within the predetermined range. Referring to FIG. 3(b), the electric home appliance may determine whether the human body is within the predetermined range for a predetermined time or more.

In a case in which the human body is within the predetermined range for the predetermined time or more, the electric home appliance may add the number of information items output by the output unit 130. In a case in which the human body is within the predetermined range for the predetermined time or more, the electric home appliance may recognize a distance d from the human body.

Referring to FIG. 3(c), the electric home appliance may recognize the distance from the human body. The electric home appliance may output information in different modes based on the distance from the human body. For example, as the distance from the human body decreases, the electric home appliance may output detailed information through the output unit 130. On the other hand, as the distance from the human body increases, the electric home appliance may output simple information through the output unit 130. For example, the electric home appliance may adjust quality of the voice output by the output unit 130 based on the distance from the human body.

The electric home appliance may decide a type of information to be output, an information output mode, etc. based on a distance value from the human body. For example, the electric home appliance may decide the type, quality, and volume of a notification sound output by the output unit 130 or the type of information output by the output unit 130 based on a distance range, within which the distance value from the human body is. However, the present application is not limited thereto.

Referring to FIG. 4(a), the output unit of the electric home appliance 100 may be a speaker 134 for outputting a sound. In some cases, the sound may be a voice. In a case in which an event indicating that it is necessary to provide information to a user has occurred, the electric home appliance 100 may output a notification sound through the output unit 130. The electric home appliance 100 may adjust the volume of the notification sound according to a noise level of the surroundings.

Referring to FIG. 4(b), the electric home appliance 100 may sense approach of a human body for a predetermined time after the event has occurred. The electric home appliance 100 may determine whether the user responds to the event within the predetermined time.

Referring to FIG. 4(c), in a case in which there is no user response to the event for the predetermined time after the event has occurred, the electric home appliance 100 may output a notification sound having larger volume than the previous notification sound.

In a case in which there is no user response to the event for the predetermined time after the event has occurred, the electric home appliance 100 may output a notification sound having lower quality than the previous notification sound or a notification sound of a different type than the previous notification sound. However, the present application is not limited thereto.

Referring to FIG. 5, the electric home appliance according to the implementation of the present application may be a refrigerator 200.

Referring to FIG. 5(a), in a case in which the electric home appliance is a refrigerator 200, the electric home appliance 200 may determine whether an event has occurred. For example, the electric home appliance 200 may determine whether a door of the refrigerator is open.

Referring to FIG. 5(b), in a case in which an event indicating that the door of the refrigerator is open has occurred, the electric home appliance 200 may sense whether a human body is within a predetermined range through the sensing unit 140.

Referring to FIG. 5(c), the electric home appliance 200 may determine whether the human body is within the predetermined range through the sensing unit for a predetermined time or more. The electric home appliance 200 may determine whether there is a user action corresponding to the event.

Referring to FIG. 5(d), in a case in which the human body deviates from the predetermined range within the predetermined time or more or there is no user action corresponding to the event for the predetermined time or more, the electric home appliance 200 may output a notification sound through the speaker 134.

In another implementation, in a case in which the human body is within the predetermined range for the predetermined time or more after the event has occurred, the electric home appliance 200 may defer outputting a notification sound. In a case in which the human body is within the predetermined range for the predetermined time or more after the event has occurred, the electric home appliance 200 may provide information to the user through an output unit for visually outputting the information. However, the present application is not limited thereto.

Figure 6:
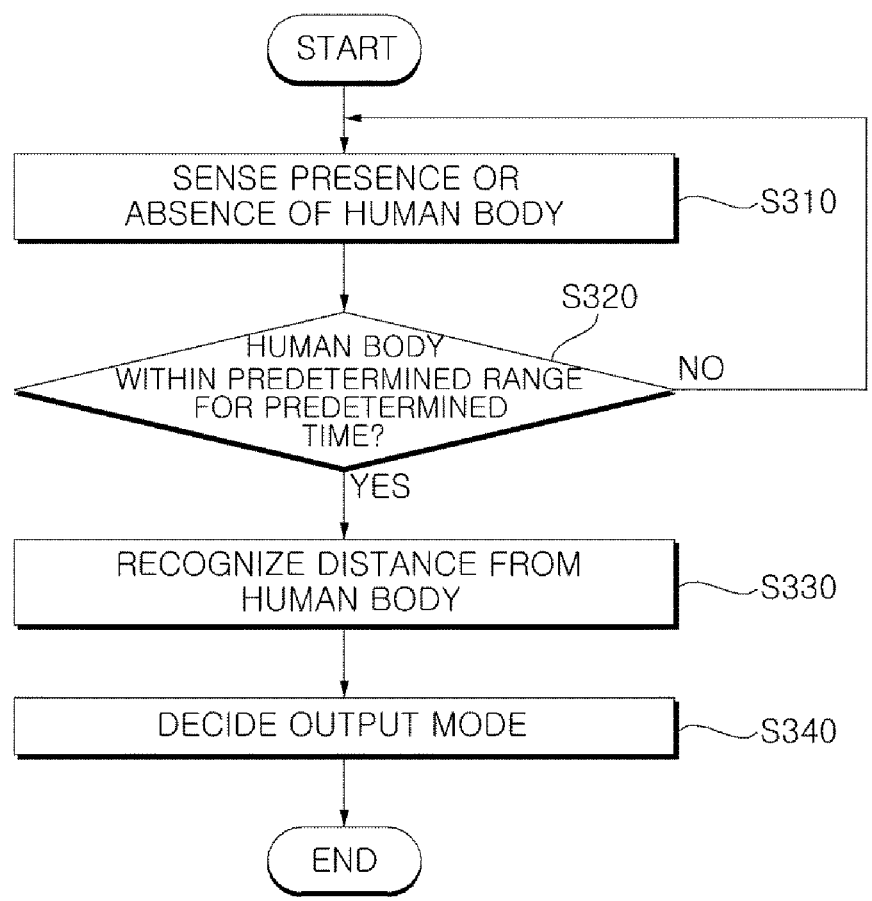
FIG. 6 is a flowchart showing an example control method of an electric home appliance according to an implementation of the present application.

FIG. 6 illustrates an example flowchart for a control method of an electric home appliance according to an implementation of the present application.

Referring to FIG. 6, a control method of an electric home appliance according to an implementation of the present application includes a step of sensing whether a human body is within a predetermined range (S310), a step of calculating a distance value from the human body (S330), and a step of deciding a output mode, for example a voice output mode, of an output unit based on presence or absence of the human body and the distance value from the human body (S340).

The step of sensing whether the human body is within the predetermined range (S310) may sense presence or absence of the human body through the sensing unit. The control method of the electric home appliance according to the implementation of the present application may further include a step of recognizing a time during which the human body is within the predetermined range (S320) after the step of sensing whether the human body is within the predetermined range (S310). That is, the controller 210 may sense presence or absence of the human body through the sensing unit 240 (S310). In a state in which the presence of the human body is sensed, the controller 210 may determine whether the human body is within the predetermined distance for a predetermined time or more (S320).

The step of sensing whether the human body is within the predetermined range (S310) may include the step of determining whether the human body is within the predetermined distance for the predetermined time or more (S320). The step of determining whether the human body is within the predetermined distance for the predetermined time or more (S320) may initialize time in a case in which the human body deviates from the predetermined distance. The step of determining whether the human body is within the predetermined distance for the predetermined time or more (S320) may recalculate time from the beginning in a case in which the human body reenters the predetermined range. That is, in a case in which the human body deviates from the predetermined distance, the controller 210 may initialize time. In addition, in a case in which the human body reenters the predetermined range, the controller 210 may recalculate time from the beginning.

The step of calculating the distance value from the human body (S330) may calculate a value of the distance from the human body in a case in which the human body is within the predetermined range for the predetermined time or more. That is, in a case in which the human body is within the predetermined range for the predetermined time or more, the controller 210 may calculate the value of the distance from the human body (S330).

The step of deciding the information output mode of the output unit based on presence or absence of the human body and the distance value from the human body (S340) may decide a sound output mode, such as a voice output mode, based on the distance value from the human body in a case in which the human body is within the predetermined range for the predetermined time or more. That is, in a case in which the human body is within the predetermined range for the predetermined time or more, the controller 210 may decide the voice output mode based on the distance value from the human body (S340). As the distance from the human body decreases, the electric home appliance may decrease the volume of the voice and increase quality of the voice. However, the present application is not limited thereto.

For example, the information output mode may be volume, quality, or type of a voice outputting information or type of information. However, the present application is not limited thereto.

For example, at the step of deciding the information output mode of the output unit (S340), the controller 210 may control the output unit to defer outputting a notification sound in a case in which the human body is within the predetermined range for the predetermined time or more. At the step of deciding the information output mode of the output unit (S340), the controller 210 may increase quality of the notification sound output by the output unit as the distance value from the human body decreases.

For example, at the step of deciding the information output mode of the output unit (S340), the controller 210 may adjust a sampling interval of the notification sound output by the output unit based on the distance value from the human body.

Figure 7:
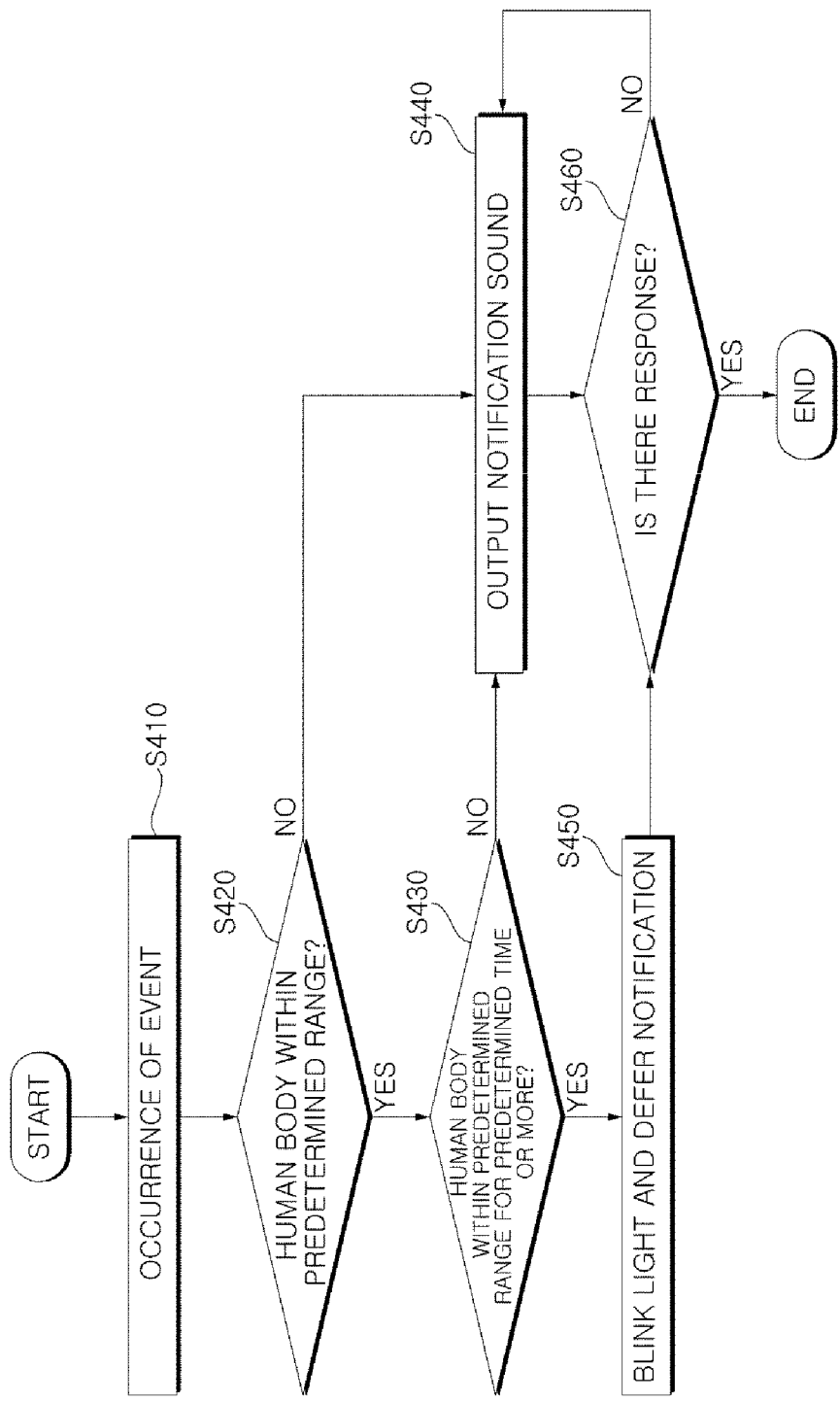
FIG. 7 is a flowchart showing an example control method of an electric home appliance according to another implementation of the present application.

FIG. 7 illustrates an example flowchart for a control method of an electric home appliance according to another implementation of the present application.

Referring to FIG. 7, a control method of an electric home appliance according to another implementation of the present application includes a step of sensing an event indicating that it is necessary to provide information to a user (S410), a step of determining whether a human body is within a predetermined range (S420), a step of determining whether the human body is within the predetermined range for a predetermined time or more (S430), and steps of deciding an information provision mode based on location of the human body (S440 and S450).

The step of sensing the event indicating that it is necessary to provide information to the user (S410) may determine whether the event indicating that it is necessary to provide information to the user has occurred. In a case in which the event indicating that it is necessary to provide information to the user has occurred, the electric home appliance may determine whether the human body is within the predetermined range (S420). That is, the controller 210 may determine whether the event indicating that it is necessary to provide information to the user has occurred. The controller 210 may receive event information through various sensors included in the electric home appliance to determine whether the event has occurred. In a case in which the event has occurred, the controller 210 may sense whether the human body is within the predetermined range through the sensing unit 240 (S420).

In a case in which the human body is within the predetermined range, the electric home appliance may determine whether the human body is within the predetermined range for the predetermined time or more (S430). That is, upon determining that the human body is within the predetermined range, the controller 210 may determine whether the human body is within the predetermined range for the predetermined time or more.

The steps of deciding the information provision mode (S440 and S450) may decide a sound output mode, such as a voice output mode. In a case in which an event indicating that it is necessary to provide a notification sound to the user has occurred, the electric home appliance may decide whether to output a notification sound based on determination as to whether the human body is within the predetermined range when the event has occurred.

In a case in which the human body is within the predetermined range for the predetermined time or more, the electric home appliance may defer outputting the notification sound through the output unit (S450). In a case in which the human body is within the predetermined range for the predetermined time or more, the electric home appliance may provide visual information through the output unit (S450). That is, in a case in which the human body is within the predetermined range for the predetermined time or more, the controller 210 may control the output unit to provide visual information (S450).

The steps of deciding the information provision mode (S440 and S450) may decide a voice output mode of the output unit of the electric home appliance. In a case in which the human body is not within the predetermined range for the predetermined time or more, the electric home appliance may output a notification sound (S440). That is, in a case in which the human body is not within the predetermined range for the predetermined time or more, the controller 210 may output the notification sound (S440).

In a case in which the notification sound has been output or the visual information has been provided, the electric home appliance may determine whether there is a user response to the event (S460). That is, the controller 210 may determine whether there is a user response to the event (S460).

In a case in which there is no user response to the event for a predetermined time or more although the notification sound has been output or the visual information has been provided, the controller 210 may change the volume, type, or quality of the notification sound and output the changed notification sound. However, the present application is not limited thereto.

For example, at the step of deciding the voice output mode, the controller 210 may output a notification sound in a case in which the human body deviates from the predetermined range without responding to the event.

In another implementation, the control method of the electric home appliance may further include a step of sensing a noise level of the surroundings. At the step of deciding the notification sound output mode of the electric home appliance, the controller 210 may decide the volume of an output voice based on the noise level of the surroundings.

As is apparent from the above description, an electric home appliance and a control method thereof according to an implementation of the present application may have the following and other effects.

In the electric home appliance and the control method thereof according to the implementation of the present application, it is possible to adjust the volume or type of a sound output, such as a voice output, by the output unit based on location of a user such that the user can easily recognize a state of the electric home appliance.

In the electric home appliance and the control method thereof according to the implementation of the present application, it is possible to change an information provision mode of the output unit based on location of a user when an event has occurred, thereby preventing provision of necessary information and efficiently providing information.

In the electric home appliance and the control method thereof according to the implementation of the present application, it is possible to provide a voice having higher quality when a user is within a short distance, thereby effectively providing information to the user.

In the electric home appliance and the control method thereof according to the implementation of the present application, it is possible to change an output mode in a case in which there is no user response although information, such as a notification sound, is provided to the user, thereby properly providing information to the user.

Although all elements constituting the implementations of the present application are described to be integrated into a single one or to be operated as a single one, the present application is not necessarily limited to such implementations. According to implementations, all of the elements may be selectively integrated into one or more and be operated as one or more within the object and the scope of the present application.

Each of the elements may be implemented as independent hardware. Alternatively, some or all of the elements may be selectively combined into a computer program having a program module performing some or all functions combined in one or more pieces of hardware.

A plurality of codes and code segments constituting the computer program may be easily reasoned by those skilled in the art to which the present application pertains. The computer program may be stored in a computer readable media such that the computer program is read and executed by a computer to implement implementations of the present application. Computer program storage media may include magnetic recording media, optical recording media, and carrier wave media.

The term "comprises", "includes", or "has" described herein should be interpreted not to exclude other elements but to further include such other elements since the corresponding elements may be inherent unless mentioned otherwise.

All terms including technical or scientific terms have the same meanings as generally understood by a person having ordinary skill in the art to which the present application pertains unless mentioned otherwise.

Generally used terms, such as terms defined in a dictionary, should be interpreted to coincide with meanings of the related art from the context. Unless obviously defined in the present application, such terms are not interpreted as ideal or excessively formal meanings.

Although the preferred implementations of the present application have been disclosed for illustrative purposes, those skilled in the art will appreciate that various modifications, additions and substitutions are possible without departing from the scope and spirit of the application as disclosed in the accompanying claims.

The implementations disclosed in the present application are provided not to limit the technical concept of the present application but to illustrate the technical concept of the present application. Therefore, the scope of the technical concept of the present application is not limited by such implementations. The scope of the protection of the present application should be determined by reasonable interpretation of the appended claims and all technical concepts coming within the equivalency range of the present application should be interpreted to be embraced in the scope of the right of the present application.

What is claimed is:

1. A refrigerator comprising:
    a sensing unit configured to sense whether a user's body is within a predetermined range from the refrigerator;
    an output unit that comprises a display unit configured to visually provide information and a speaker configured to output a sound that provides information to the user; and
    a controller configured to determine an output mode of the output unit based on a location of the user's body sensed by the sensing unit,
    wherein the controller is further configured to:
        determine whether an event indicating that a door of the refrigerator is open has occurred,
        based on an occurrence of the event, determine whether the user's body is within the predetermined range,
        recognize a period of time during which the user's body is within the predetermined range,
        based on a determination that the period of time is greater than or equal to a predetermined time after the event has occurred, control the display unit to visually provide information,
        based on a determination that the user's body is within the predetermined range for less than the predetermined time after the event has occurred, control the output unit to output a notification sound, and
        based on a determination that the user's body deviates from the predetermined range without responding to the event, control the speaker to output the sound.

2. The refrigerator according to claim 1, wherein
    the sensing unit comprises a noise sensor that is configured to sense a noise level of a surrounding environment, and
    the controller is configured to determine a volume of the sound output by the output unit based on the noise level sensed by the noise sensor.

3. The refrigerator according to claim 1, wherein the controller decides a volume and a quality of the sound output by the output unit based on whether the user's body is within the predetermined range.

4. The refrigerator according to claim 1, wherein the controller is configured to determine whether the user's body approaches the refrigerator within a predetermined time after a first notification sound is output through the output unit.

5. The refrigerator according to claim 4, wherein the controller is configured to, based on a determination that the user's body does not approach the refrigerator within the predetermined time after the first notification sound is output through the output unit, output a second notification sound having a different volume or type than the first notification sound through the output unit.

6. The refrigerator according to claim 1, wherein the controller is configured to adjust a sampling interval of a notification sound that is output by the output unit based on a distance value from the user's body.

7. The refrigerator according to claim 1, wherein the output unit is configured to output a voice.

8. A refrigerator comprising:
a sensing unit configured to sense whether a user's body is within a predetermined range from the refrigerator;
an output unit that comprises a display unit configured to visually provide information and a speaker configured to output a sound that provides information to the user; and
a controller configured to determine an output mode of the output unit based on a location of the user's body sensed by the sensing unit,
wherein the controller is further configured to:
determine whether an event indicating that a door of the refrigerator is open has occurred,
based on an occurrence of the event, determine whether the user's body is within the predetermined range,
recognize a period of time during which the user's body is within the predetermined range,
based on a determination that the period of time is greater than or equal to a predetermined time after the event has occurred, control the display unit to visually provide information, and
based on a determination that the user's body deviates from the predetermined range without responding to the event, control the speaker to output the sound, and wherein the controller is further configured to:
determine whether the user's body approaches the refrigerator within a predetermined time after a first notification sound is output through the output unit, and
based on a determination that the user's body does not approach the refrigerator within the predetermined time after the first notification sound is output through the output unit, output a second notification sound having a different volume than the first notification sound through the output unit.

9. A refrigerator comprising:
a sensing unit configured to sense whether a user's body is within a predetermined range from the refrigerator;
an output unit that comprises a display unit configured to visually provide information and a speaker configured to output a sound that provides information to the user; and
a controller configured to determine an output mode of the output unit based on a location of the user's body sensed by the sensing unit,
wherein the controller is further configured to:
determine whether an event indicating that a door of the refrigerator is open has occurred,
based on an occurrence of the event, determine whether the user's body is within the predetermined range,
recognize a period of time during which the user's body is within the predetermined range,
based on a determination that the period of time is greater than or equal to a predetermined time after the event has occurred, control the display unit to visually provide information, and
based on a determination that the user's body deviates from the predetermined range without responding to the event, control the speaker to output the sound, and wherein the controller is further configured to:
determine whether the user's body approaches the refrigerator within a predetermined time after a first notification sound is output through the output unit, and
based on a determination that the user's body does not approach the refrigerator within the predetermined time after the first notification sound is output through the output unit, output a second notification sound that is a different type than the first notification sound through the output unit.

10. The refrigerator according to claim 1, wherein the controller is further configured to:
based on a determination that a distance value of the user's body from the refrigerator decreases, decrease a luminance value of the display unit;
based on a determination that the distance value of the user's body from the refrigerator increases, increase the luminance value of the display unit.

11. The refrigerator according to claim 1, wherein the sensing unit is further configured to sense pupils of the user, and
wherein the controller is further configured to:
based on motion of the pupils of the user, determine whether the user gazes at the refrigerator; and
adjust luminance of the display unit based on a determination whether the user's body gazes at the refrigerator.

12. A refrigerator comprising:
a sensing unit configured to sense whether a user's body is within a predetermined range from the refrigerator;
an output unit that comprises a display unit configured to visually provide information and a speaker configured to output a sound that provides information to the user; and
a controller configured to determine an output mode of the output unit based on a location of the user's body sensed by the sensing unit,
wherein the controller is further configured to:
determine whether an event indicating that a door of the refrigerator is open has occurred,
based on an occurrence of the event, determine whether the user's body is within the predetermined range,
recognize a period of time during which the user's body is within the predetermined range,
based on a determination that the period of time is greater than or equal to a predetermined time after the event has occurred, control the display unit to visually provide information, and
based on a determination that the user's body deviates from the predetermined range without responding to the event, control the speaker to output the sound, and
wherein the display unit is further configured to output text that indicates that the period of time is greater than or equal to the predetermined time after the event has occurred.

13. A refrigerator comprising:
a sensing unit configured to sense whether a user's body is within a predetermined range from the refrigerator;
an output unit that comprises a display unit configured to visually provide information and a speaker configured to output a sound that provides information to the user; and a controller configured to determine an output mode of the output unit based on a location of the user's body sensed by the sensing unit, wherein the controller is further configured to:
- determine whether an event indicating that a door of the refrigerator is open has occurred,
- based on an occurrence of the event, determine whether the user's body is within the predetermined range,
- recognize a period of time during which the user's body is within the predetermined range,
- based on a determination that the period of time is greater than or equal to a predetermined time after the event has occurred, control the display unit to visually provide information, and
- based on a determination that the user's body deviates from the predetermined range without responding to the event, control the speaker to output the sound, and wherein the controller is further configured to, based on a determination that the user's body deviates from the predetermined range without closing the door of the refrigerator after the display unit visually provides information indicating the door of the refrigerator is open, control the speaker to output the sound.

* * * * *